(12) United States Patent
Hawel et al.

(10) Patent No.: US 8,531,179 B2
(45) Date of Patent: Sep. 10, 2013

(54) METHOD AND DEVICE FOR THE DETECTION OF CURRENT ASYMMETRIES IN THREE-PHASE CIRCUITS

(75) Inventors: Daniel Hawel, Detmold (DE); Andre Korrek, Marienmünster (DE); Elmar Schaper, Lügde (DE); Stephan Hansmeier, Bad Salzuflen (DE); Lutz Heuer, Blomberg (DE); Bernd Schulz, Steinheim (DE)

(73) Assignee: Phoenix Contact GmbH & Co. KG (DE)

( * ) Notice: Subject to any disclaimer, the term of this patent is extended or adjusted under 35 U.S.C. 154(b) by 222 days.

(21) Appl. No.: 13/226,611

(22) Filed: Sep. 7, 2011

(65) Prior Publication Data

US 2012/0056613 A1 Mar. 8, 2012

(30) Foreign Application Priority Data

Sep. 8, 2010 (DE) .......................... 10 2010 037 396

(51) Int. Cl.
*G01R 19/00* (2006.01)

(52) U.S. Cl.
USPC ......................................................... 324/107

(58) Field of Classification Search
USPC ..................................... 324/107, 765.01, 142
See application file for complete search history.

(56) References Cited

U.S. PATENT DOCUMENTS

| 3,651,377 | A | * | 3/1972 | Souillard | 361/82 |
| 4,641,088 | A | | 2/1987 | Jacobsson | |
| 5,058,031 | A | | 10/1991 | Swanson et al. | |
| 5,153,506 | A | * | 10/1992 | Trenkler et al. | 374/163 |
| 5,426,590 | A | * | 6/1995 | Martin | 700/294 |
| 6,185,508 | B1 | * | 2/2001 | Van Doorn et al. | 702/60 |
| 6,262,550 | B1 | * | 7/2001 | Kliman et al. | 318/565 |
| 2010/0194323 | A1 | * | 8/2010 | Premerlani et al. | 318/490 |

FOREIGN PATENT DOCUMENTS

EP 2083493 7/2009

* cited by examiner

*Primary Examiner* — Jermele M Hollington
*Assistant Examiner* — Demetrius Pretlow
(74) *Attorney, Agent, or Firm* — Schmeiser, Olsen & Watts, LLP

(57) ABSTRACT

A device (10) for the detection of current asymmetries in three-phase circuits (L1, L2, L3) is provided. This device (10) has a first current measuring mechanism (S1) for the measurement of first phase (L1) and a second current measuring mechanism (S3) for the measurement of a second phase (L3). Furthermore, the device has a computing unit (ALU) which determines a current symmetry value ($N_{2,3}$; $N_{1,2}$) of the third phase (L2) relative to the first phase (L1) or second phase (L3) from the measured first phase and from the measured second phase. Moreover, an associated method is also provided.

14 Claims, 3 Drawing Sheets

Figure 1:
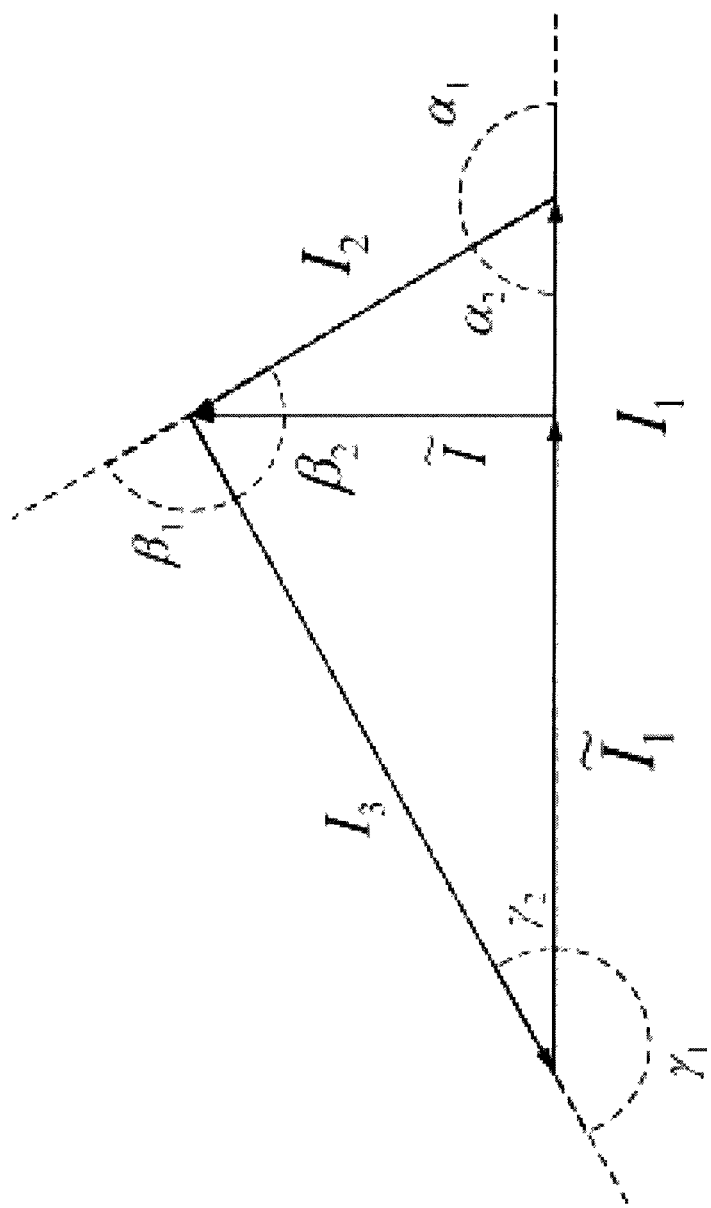

METHOD AND DEVICE FOR THE DETECTION OF CURRENT ASYMMETRIES IN THREE-PHASE CIRCUITS

FIELD OF TECHNOLOGY

The following related to monitoring which can be necessary in many applications of three-phase devices.

BACKGROUND

The asymmetry of the individual phases is also monitored in three-phase electric motors in particular because it allows conclusions on the condition of the motor or its load behavior.

For this purpose, all three phases have been monitored heretofore and a characteristic value was determined from the individually measured phases. If the characteristic value was outside a specific range, the motor was immediately deactivated.

Such a method has been known from e.g. EP 2 083 493, where a maximum current was first defined by means of the three determined phases, and three asymmetry values were subsequently determined which were jointly incorporated into a motor model.

Such a method is complex from several points of view. On the one hand, all three phases have to be measured, and on the other hand, a large number of calculations is required.

It is therefore the object of the invention to provide a method and a device for the detection of current asymmetries in three-phase circuits, which solves one or several disadvantages of the prior art in an innovative manner.

SUMMARY

This object is attained in that a device for the detection of current asymmetries in three-phase circuits is proposed by the invention, having a first current measuring device for measurement of a first phase and a second current measuring device for measurement of a second phase.

Furthermore, the device has a computing unit which determines a current symmetry value of the third phase relative to the first phase or to the second phase from the measured first phase and from the measured second phase.

In a further embodiment, the computing unit determines a deviation from a specified range from the determined current symmetry value of the third phase relative to the first or to the second phase.

In still a further embodiment of the invention, the computing unit also determines a current symmetry value of the first phase and of the second phase from the measured first phase and from the measured second phase.

Moreover, a further embodiment can provide that the computing unit determines a deviation from a specified range from the determined current symmetry value of the first phase and of the second phase.

In a further refinement of the invention, the device also has a switch-off mechanism for switching off the first, second and third phase.

In still another refinement of the invention, the switching off is activated by the computing unit on detection of a current asymmetry outside the specified range.

This switching off can also be activated in a time-delayed manner

A further embodiment can also provide that the device has a mechanism for signaling a detected current asymmetry.

The solution proposed by the invention is a method for the detection of current asymmetries in three-phase circuits. This method has steps for measuring the current of a first phase and for measuring the current of a second phase.

The method further has a step for determining a current symmetry value of the third phase relative to the first or to the second phase from the measured first phase and from the measured second phase.

In a further embodiment, the method has a step for determining a deviation of the current symmetry value of the third phase relative to the first or second phase from a specified range.

In still another embodiment of the invention the method has a step for determining the current symmetry value of the first phase and of the second phase from the measured first phase and from the measured second phase.

Moreover, a further embodiment can provide that the method also has a step for determining a deviation from a specified range from the determined current symmetry value of the first phase and of the second phase.

In another refinement of the invention, the method also has a step for switching off the first, second and third phase.

In still another refinement of the invention, the switching off is activated on detection of a current asymmetry outside a specified range.

This switching off can also be activated in a time-delayed manner. A further embodiment can also provide that the method has a step for signaling a detected current asymmetry.

BRIEF DESCRIPTION

The invention will hereinafter be described with reference to the figures, which show FIG. 1 a drawing of angular relationships in order to describe the theoretical background, FIG. 2 a schematically illustrated embodiment of a device according to the present invention, and FIG. 3 a schematic diagram of the method according to the present invention.

DETAILED DESCRIPTION

In order to understand the description below it is assumed that only the current $I_2$ is determined at phase L1 and $I_3$ is determined at phase L3, whereas the current $I_2$ is not determined at phase L2.

It is further assumed that also the phase position of the currents $I_2$ and $I_3$ relative to one another has already been known or determined as the phase angle $\gamma_1$.

Under the assumption that the sum of the currents $\vec{I}_1 + \vec{I}_2 + \vec{I}_3 = 0$, the angular relationship shown in FIG. 1 can be set up, wherein $\tilde{I}_1$ and $\tilde{I}$ are only auxiliary variables. In this case, $\tilde{I}$ mathematically corresponds to the height of the triangle and $\tilde{I}_1$ to the projection of $\vec{I}_3$ on $\vec{I}_1$ in terms of values.

Physically, the assumption means that the currents add to zero so that no current flows through a possibly present phase-to-ground short or neutral conductor.

The relationship shown below now exists among the angles:

$$\alpha_1 + \alpha_2 = \pi$$

$$\beta_1 + \beta_2 = \pi$$

$$\gamma_1 + \gamma_2 = \pi$$

From the measured variable $I_3$ and from the angle $\gamma_1$ results:

$$\tilde{I} = I_3 \cdot \sin(\gamma_2)$$

$$\tilde{I}_1 = I_3 \cdot \cos(\gamma_2)$$

From this, the current that was not measured $$I_2 = \sqrt{(\tilde{I}_1 - I_1)^2 + \tilde{I}^2}$$

can be determined.

For the recorded values this formula is $$I_2 = \sqrt{(I_3 \cdot \cos(\gamma_2) - I_1)^2 + (I_3 \cdot \sin(\gamma_2))^2}$$

This current value can now be scaled to $I_3$. The scaled value characterizes the current asymmetry $N_{2,3}$ below.

$$N_{2,3} = \sqrt{1 - 2(\cdot \cos(\gamma_2)) + \left(\frac{I_1}{I_3}\right)^2}$$

It is apparent that in the case where $I_3=0$ a separate consideration would be necessary.

In case $I_3=0$, and we have $$I_2 = \sqrt{(0 \cdot \cos(\gamma_2) - I_1)^2 + (0 \cdot \sin(\gamma_2))^2} = I_1.$$

A current asymmetry $N_{1,2}$; $N_{1,3}$ could also be stated in the same way.

On the basis of the considerations set out in FIG. 1, it is now possible to specify a mechanism 10 for the detection of current asymmetries in a three-phase circuit L1, L2, L3.

Figure 2:
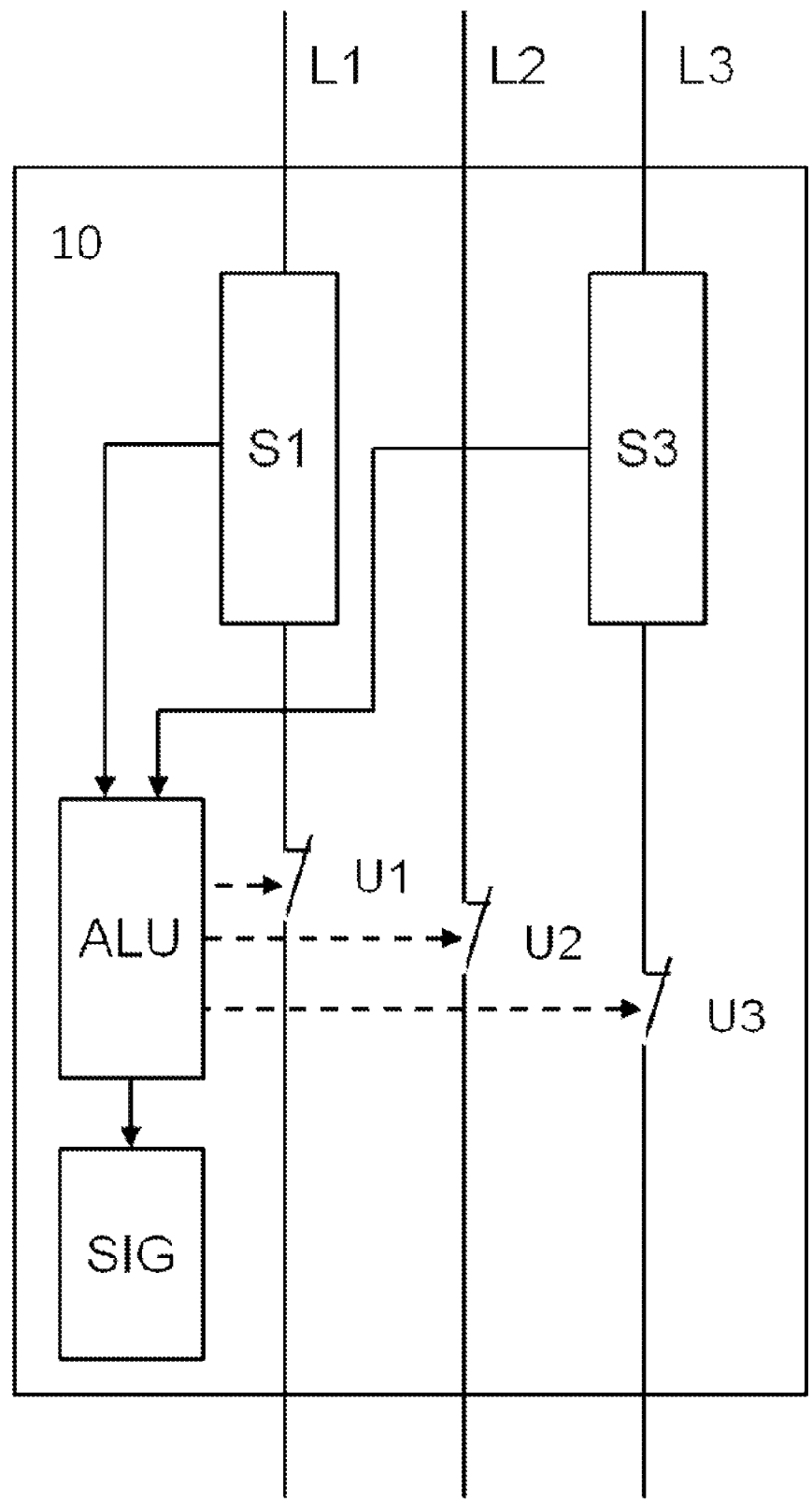
Figure 3:
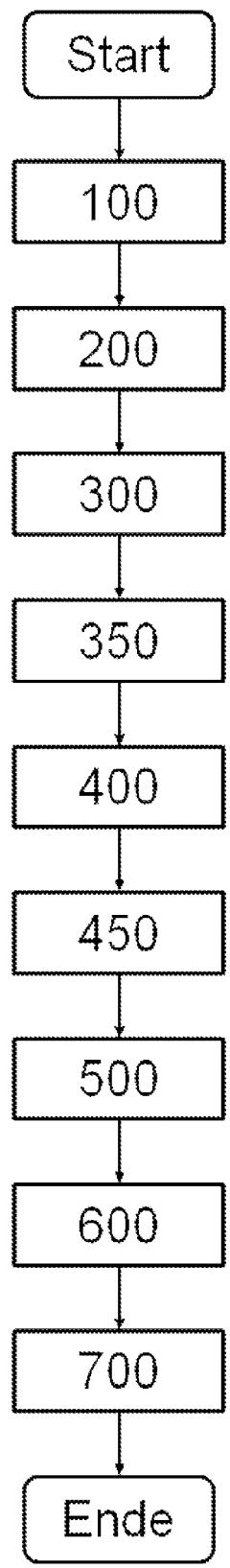

As shown in FIG. 2, said mechanism has a first current measuring device S2 for the measurement of a first phase L1, and a second current measuring device S3 for the measurement of a second phase L3. Any other pair of phases can obviously be used for measuring.

Appropriate measuring devices can be of an inductive or ohmic nature.

The mechanism further has a computing unit ALU which determines a current symmetry value $N_{1,2}$ of the third phase L2 relative to the first phase L1, or a current symmetry value $N_{2,3}$ of the third phase L2 relative to the second phase L3, as shown above, from the measured first phase and from the measured second phase.

Such a computing unit can be a microcontroller or also a microprocessor, an ASIC or an FPGA. Furthermore, the computing unit ALU can also determine a deviation from a specified range from the determined current symmetry value $N_{1,2}$; $N_{2,3}$ for the third phase relative to the first or second phase.

This deviation can be determined, for example, at the level of the current symmetry value, but also from the resultant angle.

If the determined phase angle $\gamma$ exceeds or falls below a certain upper or lower limit, it can be used as an indication of a malfunction.

For example, it can be specified that the current symmetry value N should be in the range of $0.75<N<1.25$ or $0.7<N<1.3$ or $0.8<N<1.2$ or $0.8<N<1.1$, or the like.

Moreover, the computing unit ALU can determine a current symmetry value $N_{1,3}$ of the first phase and of the second phase from the measured first phase and from the measured second phase.

A first symmetry can already be determined by means of this calculation which was made directly from the measured values. It can thus, for example, be already specified that the current symmetry value N should be in the range of $0.75<N<1.25$ or $0.7<N<1.3$ or $0.8<N<1.2$ or $0.8<N<1.1$, or the like.

If the range of values is limited by $N_{1,3}$ in this way, the possible range of values for $N_{1,2}$ or $N_{2,3}$ is also limited.

Such a limitation allows for the determination of a current symmetry value $N_{1,2}$; $N_{2,3}$ of the third phase relative to the first or second phase on the basis of an admissible range of values for $\gamma_2$.

Thus it can be specified, for example, that $\gamma_{AP}-15°<\gamma_2<\gamma_{AP}+15°$, or $\gamma_{AP}-10°<\gamma_2<\gamma_{AP}+10°$, or $\gamma_{AP}-5°<\gamma_2<\gamma_{AP}+5°$ is selected, an admissible phase angle in the working point being $\gamma_{AP}$.

It is self-evident that the admissible angular range can also be a function of $N_{1,3}$. The range can thus, for example, also be determined in that the limits within a selected working range can be represented as a linear approximation of the cosine function.

Moreover, it can be provided that the mechanism 10 has a switch-off mechanism, for example in the form of a break contact U1 for phase L1, a break contact U2 for phase L2 and a break contact U3 for phase L3 to switch off the respective phases L1, L2, L3.

Such a break contact U1, U2, U3 can be configured as contactor, for example.

It can further be provided that the switching off is activated by the computing unit ALU on detection of a current asymmetry outside a specified range, as mentioned above.

This switching off can also be activated in a time-delayed manner. As a result of this, a certain switch-off delay can be made available. It also conceivable to configure the time delay as a function of the asymmetry so that in case of a strong asymmetry a rather prompt or direct switching off is activated, whereas in case of a minor asymmetry, for example on slightly exceeding the limits, e.g. in a range of 5%, switching off is time-delayed within the minutes range.

It is also possible to make the switching off dependent on the persistence of an asymmetry so that exceeding the limit for a short time is not detected as a fault.

Furthermore it can be provided that the mechanism 10 has a device for signaling SIG a detected current asymmetry. Such a signaling mechanism can be of an optical, acoustic as well as of an electrical nature.

An optical signaling mechanism SIG can be, for example, an optomechanical signal, e.g. a display panel showing a change in color or contrast or a warning light.

An acoustic signaling mechanism SIG can be, for example, a loudspeaker or an acoustic signal generator.

An electrical signaling mechanism SIG can be, for example, an interface to a bus system, such as a field bus system, or IP network or the like. An innovative method for the detection of current asymmetries in three-phase circuits readily results from the description above, and will hereinafter be described, where the sequences of steps can basically be carried out in different orders unless otherwise specified.

Such a method first has the steps for measuring 100 the current of a first phase and for measuring 200 the current of a second phase.

Subsequently, a current symmetry value of the third phase relative to the first phase or to the second phase is determined from the measured first phase and from the measured second phase in a step 300.

In a further embodiment of the method a deviation of the current symmetry value of the third phase relative to the first or second phase from a specified range is determined in a step 350.

The method can optionally also determine a current symmetry value of the first phase and of the second phase from the measured first phase and from the measured second phase in a step 400.

This step 400 can also take place prior to the determination of step 300. Then the result is, for example $N_{2,3}=\sqrt{1-2(\cdot\cos(\gamma_2))+N_{1,3}{}^2}$.

Subsequent to step 400, a deviation of the determined current symmetry value of the first phase and of the second phase from a specified range can also be determined in a step 450. This step 450 can also take place prior to the determination of step 300.

Thus for example, it can be specified that the current symmetry value N should be in the range of 0.75<N<1.25 or 0.7<N<1.3 or 0.8<N<1.2 or 0.8<N<1.1, or the like.

If the range of values is limited by $N_{1,3}$ in this way, then a limitation also results for the possible range of values for $N_{1,2}$ or $N_{2,3}$.

Such a limitation allows for the determination of a current symmetry value $N_{1,2}$; $N_{2,3}$ of the third phase relative to the first or second phase on the basis of an admissible range of values for $\gamma_2$.

Thus it may be specified, for example, that $\gamma_{AP}-15°<\gamma_2<\gamma_{AP}+15°$, or $\gamma_{AP}-10°<\gamma_2<\gamma_{AP}+10°$, or $\gamma_{AP}-5°<\gamma_2<\gamma_{AP}+5°$ is selected.

It is self-evident that the admissible angular range can also be a function of $N_{1,3}$. Thus the range can also be determined, for example, in that the limits within a selected working range can be represented as a linear approximation of the cosine function.

The method can also provide that the phases L1, L2, and L3 are switched off in a step 600.

This switching off 600 can be dependent on the detection of a current asymmetry which is detected in step 500.

This switching off 600 can also be activated in a time-delayed manner. Consequently, a certain switch-off delay can be made available. It is also conceivable to configure the time delay as a function of the asymmetry so that in case of a strong asymmetry rather prompt or direct switching off is activated, whereas in case of a minor asymmetry, for example on slightly exceeding the limits, e.g. in a range of 5%, the switching off is time-delayed within the minutes range.

It is also possible to the make switching off 600 dependent on the persistence of an asymmetry so that exceeding the limit for a short time is not detected as a fault.

In a further step 700 it can be provided that a detected current asymmetry is signaled by means of appropriate measures.

Such signaling can be of an optical, acoustic, or electrical nature.

Optical signaling can be, for example, an optomechanical display device, e.g. a display panel that shows a change in color or contrast or a warning light.

Acoustic signaling can be, for example, an audible tone.

Electrical signaling can be, for example, the generation of a message in an appropriate bus system, such as a field bus system or IP network or the like, but also a status message which can be retrieved from a remote location.

It is self-evident that the ideas described above can also be used in other fields of application and the detection of symmetries is not limited to currents, but can also be applied to voltages, for example.

The invention is likewise not limited to the protection of energy consumers, although it was introduced on the basis of an electric motor, but can similarly be used for power generators.

REFERENCE NUMERALS

Device for the detection of current asymmetries 10
Phase L1, L2, L3
Current measuring mechanism S1, S2
Computing unit ALU
Switch-off mechanism U1, U2, U3
Signaling device SIG

The invention claimed is:

1. A device for the detection of current asymmetries in three-phase circuits, the device comprising:
   a first current measuring mechanism for the measurement of a first phase,
   a second current measuring mechanism for the measurement of a second phase;
   wherein the device has a computing unit which determines a current symmetry value of a third phase relative to at least one of the first phase and the second phase from the measured first phase and from the measured second phase ($N_{2,3}$; $N_{1,2}$);
   wherein the computing unit determines a deviation from a specified range from the determined current symmetry value ($N_{2,3}$; $N_{1,2}$) of the third phase relative to at least one of the first and the second phase.

2. The device according to claim 1, wherein the computing unit also determines a current symmetry value ($N_{1,3}$) of the first phase and of the second phase from the measured first phase and from the measured second phase.

3. The device according to claim 1, wherein the computing unit determines a deviation from a specified range from the determined symmetry value ($N_{1,3}$) of the first phase and of the second phase.

4. A device according to claim 1, wherein the device also has a switch-off mechanism for switching off the first, second and third phases.

5. The device according to claim 4, wherein the switching off is activated by the computing unit on detection of a current asymmetry outside a specified range.

6. The device according to claim 4, wherein the switching off is activated in a time-delayed manner by the computing unit on detection of a current asymmetry outside a specified range.

7. A device according to claim 1, wherein the device also has a mechanism for signaling a detected current asymmetry.

8. A method for the detection of current asymmetries in three-phase circuits, the method comprising:
   measuring a current of a first phase,
   measuring a current of a second phase,
   determining a current symmetry value of a third phase relative to at least one of the first phase and the second phase from the measured first phase and from the measured second phase; and
   determining a deviation of the current symmetry value of the third phase relative to at least one of the first phase and the second phase from a specified range.

9. The method according to claim 8, further having the step of determining a current symmetry value of the first phase and of the second phase from the measured first phase and from the measured second phase.

10. The method according to claim 8, further having the step of determining a deviation from a specified range from the determined current symmetry value of the first phase and of the second phase.

11. A method according to claim 8, further having the step of switching off the first, second and third phase.

12. The method according to claim 11, wherein the switching off is activated by the computing unit on detection of a current asymmetry outside a specified range.

13. The method according to claim 11, wherein the switching off is activated in a time-delayed manner on detection of a current asymmetry outside a specified range.

14. A method according to claim 8, further having the step of signaling a detected current asymmetry.

* * * * *

UNITED STATES PATENT AND TRADEMARK OFFICE
CERTIFICATE OF CORRECTION

PATENT NO. : 8,531,179 B2
APPLICATION NO. : 13/226611
DATED : September 10, 2013
INVENTOR(S) : Hawel et al.

It is certified that error appears in the above-identified patent and that said Letters Patent is hereby corrected as shown below:

<u>Title Page</u>

In Item (57) Abstract Column 2, Line 4, after "of" insert --a--

<u>In the Specification</u>

<u>Column 2</u>

Line 44, after "current" delete "$I_2$" and insert --$I_1$--

Line 48, after "currents" delete "$I_2$" and insert --$I_1$--

Signed and Sealed this
Twelfth Day of November, 2013

Teresa Stanek Rea
*Deputy Director of the United States Patent and Trademark Office*